(12) United States Patent
Chang

(10) Patent No.: US 7,179,663 B2
(45) Date of Patent: Feb. 20, 2007

(54) CDA CONTROLLER AND METHOD FOR STABILIZING DOME TEMPERATURE

(75) Inventor: Sen-Tay Chang, Fengyuan (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 90 days.

(21) Appl. No.: 10/825,871

(22) Filed: Apr. 16, 2004

(65) Prior Publication Data

US 2005/0233479 A1    Oct. 20, 2005

(51) Int. Cl.
    *H01L 21/66* (2006.01)
(52) U.S. Cl. ................... 438/14; 257/E21.521; 118/666
(58) Field of Classification Search .................. 438/14; 257/21.521; 118/666
    See application file for complete search history.

(56) References Cited

U.S. PATENT DOCUMENTS

| 4,842,683 | A | 6/1989 | Cheng et al. |
| 4,872,947 | A | 10/1989 | Wang et al. |
| 5,160,545 | A | 11/1992 | Maloney et al. |
| 6,048,798 | A * | 4/2000 | Gadgil et al. ............... 438/714 |
| 6,063,233 | A | 5/2000 | Collins et al. |
| 6,367,410 | B1 * | 4/2002 | Leahey et al. ............ 118/723 I |
| 6,527,968 | B1 | 3/2003 | Wang et al. |
| 6,545,420 | B1 | 4/2003 | Collins et al. |
| 6,547,978 | B2 | 4/2003 | Ye et al. |
| 6,566,270 | B1 | 5/2003 | Liu et al. |
| 6,572,708 | B2 | 6/2003 | Gujer et al. |
| 6,572,780 | B2 | 6/2003 | McCormack et al. |
| 6,572,814 | B2 | 6/2003 | Shamoulian et al. |
| 2004/0065645 | A1 * | 4/2004 | Welch et al. ........... 219/121.43 |

* cited by examiner

Primary Examiner—Caridad Everhart
(74) Attorney, Agent, or Firm—Duane Morris LLP

(57) ABSTRACT

A domed plasma reactor chamber uses an antenna driven by RF energy which is inductively coupled inside the reactor dome. The antenna generates a high density, low energy plasma inside the chamber for etching metals, dielectrics and semiconductor materials. Auxiliary RF bias energy applied to the wafer support cathode controls the cathode sheath voltage and controls the ion energy independent of density. The RF energy inductively coupled to the dome creates a heat that must be moderated. The invention herein utilizes a temperature-controlled airflow to supply a continuously variable air temperature over a wide range of process conditions including idling.

11 Claims, 3 Drawing Sheets

CDA CONTROLLER AND METHOD FOR STABILIZING DOME TEMPERATURE

BACKGROUND OF THE INVENTION

1. Field of the Invention

The present invention relates to an apparatus and method for stabilizing the heating and cooling of a dome in an inductively coupled RF plasma reactor of the type having a chamber dome overlying a semiconductor substrate being processed.

2. Description of the Prior Art

Control of the temperature of process chambers that are used to etch, implant, or deposit material on semiconductor substrates, is necessary to provide reliable and reproducible semiconductor fabrication processes. Many of these processes are highly temperature dependent and provide different processing rates or characteristics at different temperatures. Temperature fluctuations of a chamber are particularly undesirable during sequential processing of a batch of substrates, because the substrates are processed with different properties. For example, in etching processes, temperature fluctuations can cause the shape of the etched features on the substrate to vary widely from one substrate to another, and to vary as a function of the temperature profile across the substrate. Also, large temperature fluctuations of the chamber components or walls can cause residues that deposit on the chamber walls or ceiling to flake off and contaminate the substrate.

Another temperature control problem arises when the chamber walls and surfaces are made of ceramic materials, since ceramic materials often have a low thermal shock resistance and crack when subjected to thermal stresses resulting from large variations in temperature. For example, a chamber wall is made from a ceramic material, such as aluminum oxide, which has a low tolerance to thermal stress, when inductor coils are used to couple RF energy into the chamber. Ceramic materials that have high thermal expansion coefficients undergo a large expansion or contraction for even a small temperature change causing both the deposition and the wall to break or crack when subjected to widely different temperatures. It is desirable to control the temperature of the ceramic surfaces of process chambers and to reduce their temperature fluctuations.

Conventional temperature control systems for semiconductor process chambers include "water-jacketed" liquid recirculator systems or forced-air cooling systems. In certain processes RF induction energy is used a means to heat the process chamber. When RF is used, it irradiates the chamber and the included work piece materials through a dome at the top of the chamber. The inductor antenna is typically adjacent to the dome, which is transparent to RF energy, and essentially inductively couples RF energy into the chamber to form high-density plasma therein. Because circulating cooling liquids absorb RF forced, air-cooling is a frequent choice when this type of heat is utilized. However, forced air particularly may results in instabilities and localized hot spots on the dome. The invention herein is directed to forced-air cooling systems that are used in maintaining dome temperatures.

Forced-air cooling systems, as for example, described in U.S. Pat. No. 5,160,545, issued Nov. 3, 1992, use fans to blow cooled air past chamber surfaces. These systems often cause localized hot spots at portions of the chamber that are shielded from the air flow. Also, because the primary mode of heat transfer is conduction by air, forced air cooling Typically requires a large airflow to achieve acceptable response times to large temperature fluctuations in the chamber, such as the temperature fluctuations caused by turning on and off the plasma. The large airflow rates also typically require large fans, which are switched on and off, resulting in low reliability of the cooling system. Such breakdowns often result in damage chamber components.

It is desirable to have a process chamber temperature control system capable of producing stable temperatures to overall reduce large temperature variations in process chambers. It is further desirable for the temperature control system to stabilize temperatures in a manner that does not interfere with the operation of work pieces in the chamber, or the chamber components such as the coupled RF energy. It is further desirable for the temperature control system to reduce or eliminate thermal stresses on the chamber dome surface.

SUMMARY OF THE INVENTION

A domed plasma reactor chamber uses an antenna driven by RF energy which is inductively coupled inside the reactor dome. The antenna generates a high density, low energy plasma inside the chamber for etching metals, dielectrics and semiconductor materials. Auxiliary RF bias energy applied to the wafer support cathode controls the cathode sheath voltage and controls the ion energy independent of density. The RF energy inductively coupled to the dome creates a heat that must be moderated. The invention herein utilizes a temperature-controlled airflow to supply a continuously variable air temperature over a wide range of process conditions including idling.

A semiconductor processing apparatus comprising: (a) a process chamber comprising a support, a process gas distributor, and an exhaust; and (b) a cooling system having a continuously variable air flow responsive to temperatures changes in the dome chamber, such that dome temperature is stabilized in accordance with a preset temperature.

In one aspect of the invention, which overcomes prior art shortcomings is embodied in the construction and operation of an RF plasma processing system comprising a vacuum chamber having a source, region and a processing region; a dome for inductively coupling RF electromagnetic energy into the processing chamber for generating a plasma within the chamber to fabricate an article such as a semiconductor wafer positioned, and a cooling system having a continuously variable air flow responsive to temperatures changes in the dome chamber, such that dome temperature is stabilized in accordance with a preset temperature.

An embodiment of the present invention provides for a method of providing a continuous flow of air in a semiconductor processor for substrate processing comprising the steps of: sensing selected temperature points of measurement and maintaining an air flow proportional to a range of temperatures at selected temperature points and; maintaining a selected temperature during the time that processor is processing substrates and a when processing substrates is idle.

BRIEF DESCRIPTION OF THE DRAWING

The novel features of the present invention are set forth with particularity in the appended claims. The invention itself, however, both as to its organization and method of operation, together with further objects and advantages thereof, may be best understood by reference to the following description taken in conjunction with the accompanying drawings, in which:

DESCRIPTION OF THE PREFERRED EMBODIMENT

Figure 1:
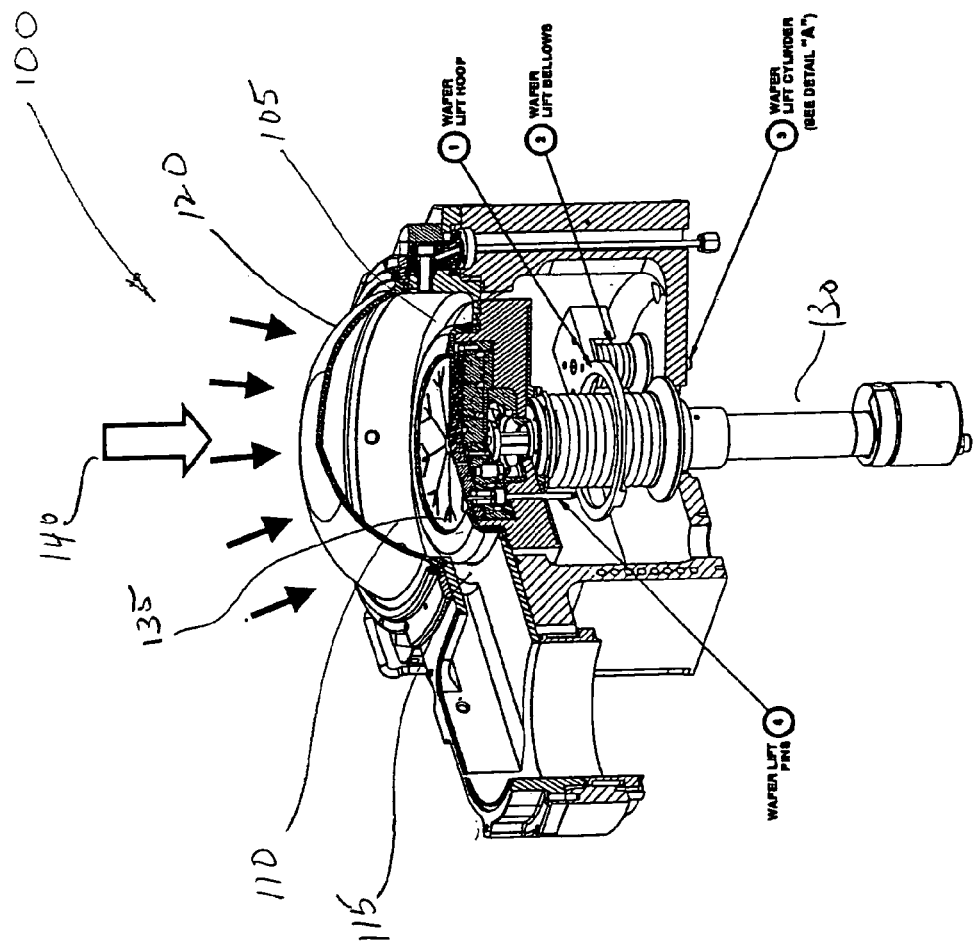
FIG. 1 is a perspective drawing of the prior art process chamber.

FIG. 1 illustrates a processing apparatus 100 of the present invention. The apparatus 100 generally includes process chamber 105 having sidewalls 110, a bottom wall 115, and a dome 120.

Semiconductor wafer 135 is held by posts or clips over which a reactant gas flows across the wafer surface 136, and then via one or more exhaust outlets to a mechanical pump (not shown) via a vacuum valve and roots blower. Process gas is introduced into the chamber 105 through a process gas distribution system that includes a gas distributor 45, a process gas supply 50 and gas feed conduits 65. The gas feed conduits 65a can extend through the sidewalls 30 to end near a peripheral edge of a substrate 70, or the gas feed conduits 65b can be positioned to extend upwardly through the bottom wall 35 and towards the periphery of the substrate 70, or the gas feed conduits 65c can extend downward through the center of the ceiling 40. In one embodiment, the gas feed conduits 65b extend through a heated silicon ring 75 that surrounds the substrate 70 and that has a circular passageway 76 for holding process gas and an array of gas injection holes 78 to distribute the process gas around the periphery of the substrate 70. An exhaust system 80 comprising one or more exhaust pumps 85 (typically including a 1000 liter/sec roughing pump), and a throttle valve 90 are used to exhaust spent process gas and control the pressure of process gas in the chamber 25. Preferably, an annulus 92 surrounding the lower portion of the chamber forms an asymmetric pumping channel that is used to pump gases out of the chamber 25 and to provide a uniform distribution of gaseous species around the surface of the substrate 70.

The process chamber 105 includes a pedestal 130 at the bottom of the chamber for supporting the substrate 135. The pedestal may also include one or more electrodes for applying a bias voltage to the wafer 135. Such a bias voltage may be a direct current (DC) bias or a RF bias.

The ceiling dome 120 of the process chamber 105 can be flat or as shown in FIG. 1 dome-shaped. The dome-shaped hemispherical ceiling 120 serves as a window to the RF induction field transmitted by an inductor antenna 140 adjacent to the ceiling 120. Typically, at least a portion of the ceiling 120 is made from materials permeable to RF, such as dielectric or semi conducting material, that has a low impedance to the RF induction field of the inductor antenna 140 or that have an electric field susceptibility that is sufficiently low to transmit the induction field generated by the inductor antenna 140 through the ceiling 120 with minimum loss of power.

Many semiconducting and dielectric materials can be used to make the RF conducting ceiling 120, such as silicon, silicon carbide, germanium, or Group III–V compound semiconductors such as gallium arsenide and indium phosphide; or Group II–III–V compound semiconductors such as mercury cadmium-telluride.

Figure 2:
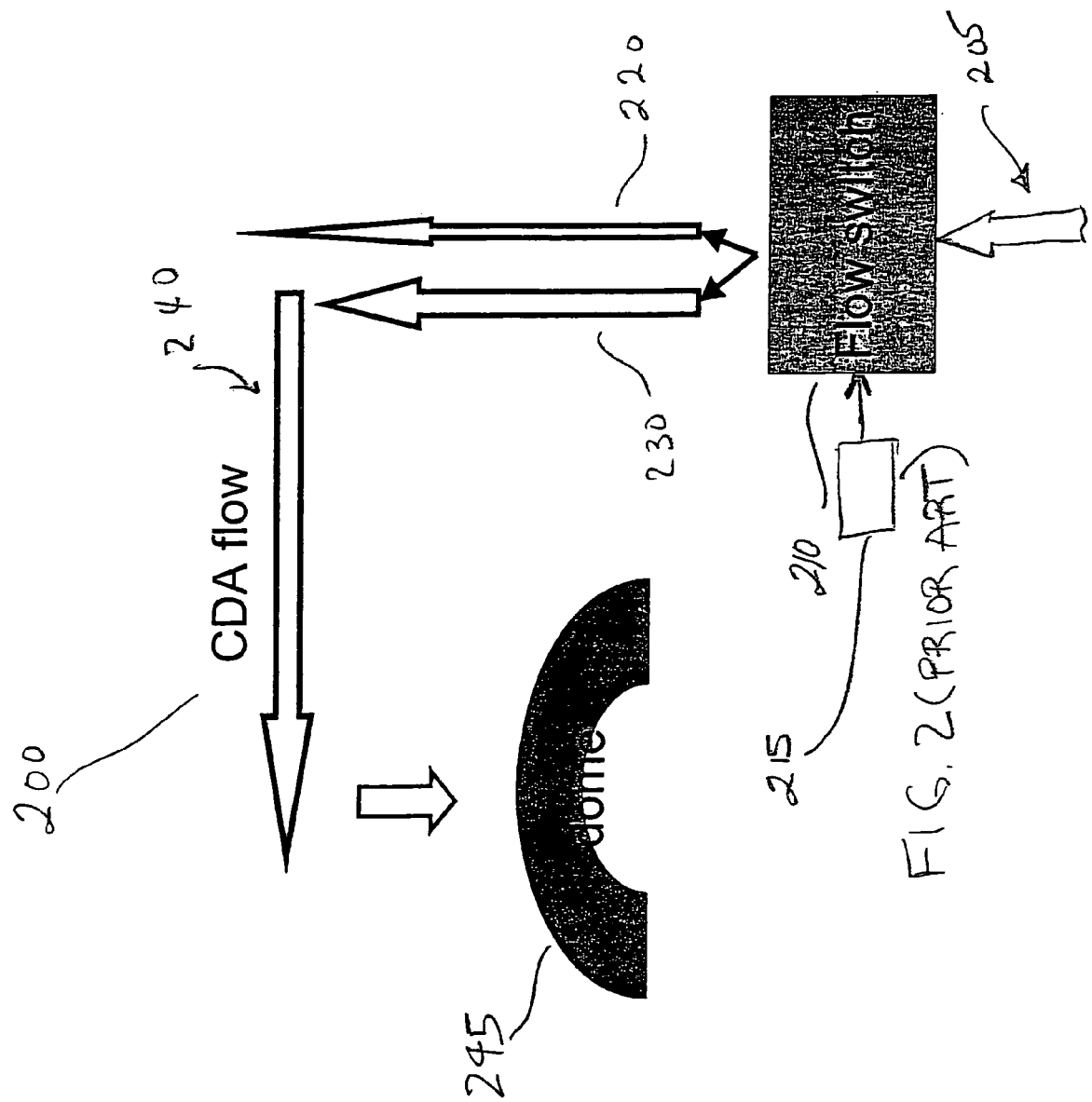
FIG. 2 is a process diagram of the prior art airflow control.

FIG. 2 is a process diagram of the prior art airflow control wherein the temperature control system 200 is regulated by a flow switch that controls to flow of air 205 utilizing a flow switch 210. The flow switch chooses between two discrete air flows, a first discrete air flow 230 representing an air flow designed to provide requisite temperature changes such as cooling and heating during processing and a second air flow designed to provide the requisite temperature changes such as cooling and heating during the time that the process is idle. The temperature of the dome 245 can be maintained at a predefined temperature as a result of the chosen air flow 240 on the basis of temperatures, selected using a thermostat 215 to provide uniform temperature gradients for substrate processing, and/or to maintain particular electrical properties in dome during processing and idling.

A suitable temperature range for the dome 245 during processing of a substrate 135 in the chamber 100 depends upon many factors, including the process gas composition and the RF power coupled to the plasma in the chamber. However, as will be apparent from the prior art in FIG. 2 the options are vastly limited. When the process is in idle, as for example when the plasma is turned off, conventional temperature control systems cause the temperature of the dome 245 to drop to low temperatures that can cause polymeric residue deposits, which can flake-off from the thermal stresses and accumulate on the chamber walls or the dome 245, damage the chamber components. Furthermore, as a result, of process/idle temperature fluctuations, etch or deposition rates can vary from one wafer to another. These temperature fluctuations can change polymer deposition rate. The polymer can flake off the dome and cause pattern defects in the wafer.

Figure 3:
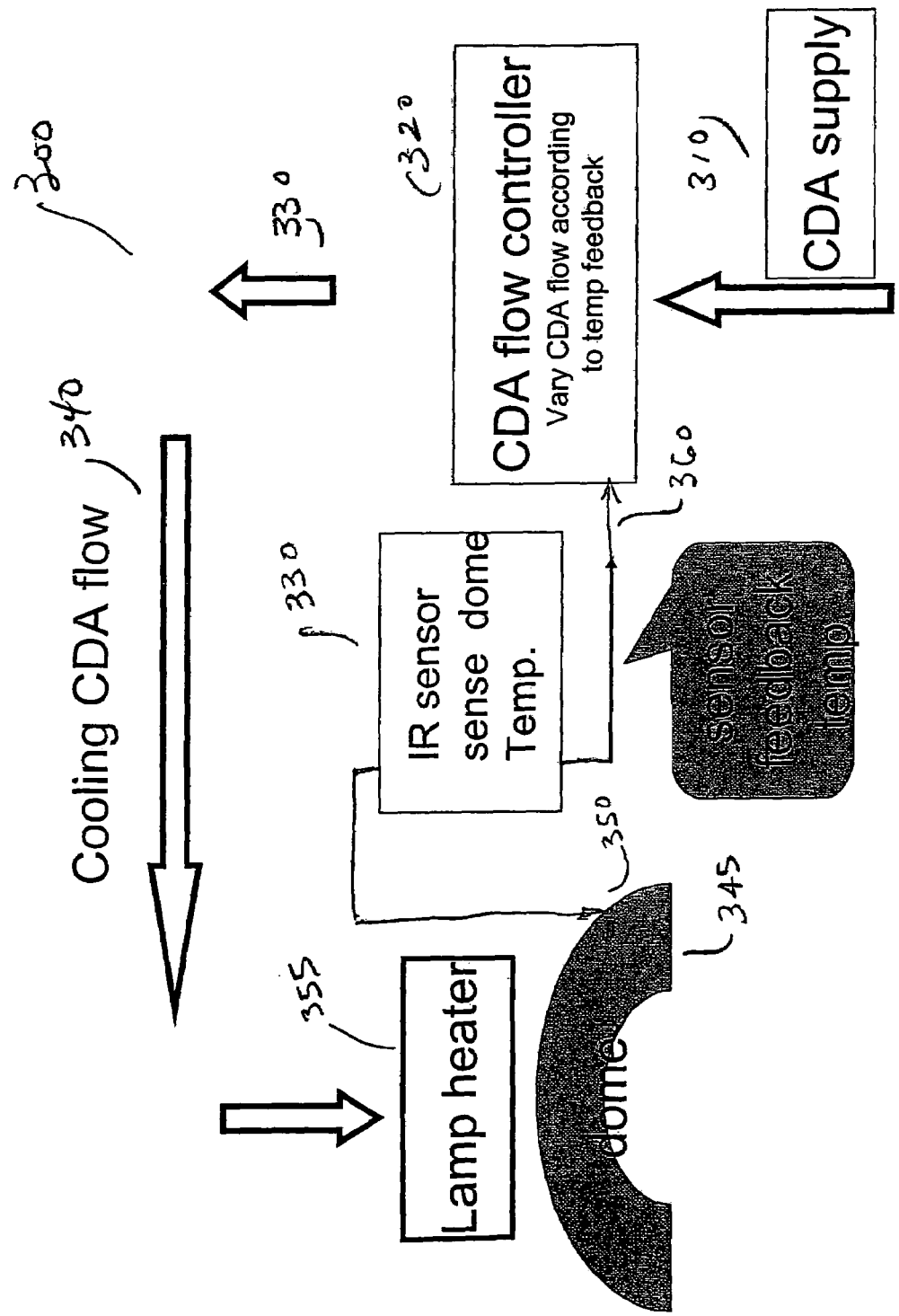
FIG. 3 is a process diagram of the present invention airflow control.

In FIG. 3, a process of the invention shows a temperature control system 300 wherein a clean dry air (CDA) flow controller 320 provides a continuous flow of CDA 330. The CDA flow 330 is proportional to a range of temperatures to provide the requisite temperature changes such as cooling during processing or when the process is idle. The temperature of the dome 345 can be maintained at a predefined temperature as a result of the chosen CDA flow 340 on the basis of temperatures, selected using temperature sensors 350, as summed by summing means 330 utilizing techniques well know to those skilled in the art of temperature control, to provide uniform temperature gradients for substrate processing, and/or to maintain particular electrical properties in dome during processing and idling. Unlike the prior art, the present invention provides a continuous range of temperatures, which are dependant upon any number of selected temperature points of measurement wherein sensors 350 can determine temperature and serve as a control means 360 utilizing techniques well know to those skilled in the art of temperature control, to adjust CDA flow through the CDA flow controller 320.

An embodiment of the present invention provides for a method of providing a continuous flow of air in a semiconductor processor for substrate processing comprising the steps of: sensing selected temperature points of measurement and maintaining an air flow proportional to a range of temperatures at selected temperature points and; maintaining a selected temperature during the time that processor is processing substrates and a when processing substrates is idle Generally, the temperature control system 300 comprises (i) a source of temperature controlled air, 310, (ii) a heat exchanger 355 such as a controllable lamp heater that can remove (or provide) heat to the chamber surface, one or more temperature sensors 350 as connected to the summing means 330 and (v) a flow controller 320 for controlling all of these components. The temperature controlled air, 310, heat exchanger 355, in combination provide multiple control mechanisms that allow rapid responses to both upward and downward fluctuations in the temperature of the dome.

Those of ordinary skill in the art of DPS chamber design will appreciate that the present invention is not limited to the use of a dome per se. Furthermore it will be recognized by those of ordinary skill in the art of DPS chamber design and semiconductor processing that the method for providing heat to a semiconductor processor for substrate processing proportional to a pre selected temperature may similarly, but in an obverse manner provide for a pre selected amount of heat to be inputted to the process and permitting the temperature to fluctuate accordingly.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. A method for providing a continuously variable clean dry air (CDA) flow in a semiconductor processor for substrate processing, comprising the steps of:
   sensing temperature measurements at selected points;
   proportionally adjusting a continuously variable CDA flow based upon the sensed temperature measurements; and
   actively controlling a dome temperature so as to maintain a predefined temperature inside a dome of the semiconductor processor during the time that the processor is processing substrates and when substrate processing is idle, wherein said active control includes said proportional adjustment of said continuously variable CDA flow.

2. The method of claim 1 further comprising the steps of: maintaining a supply of heat comprising the continuously variable CDA flow at the predefined temperature.

3. The method of claim 1 further comprising the steps of: utilizing a heat exchanger to regulate the amount of heat provided to a chamber surface of the semiconductor processor.

4. The method of claim 1 further comprising the steps of: utilizing one or more temperature sensors and a CDA flow controller for controlling upward and downward fluctuations from the predefined temperature of the dome of the semiconductor processor.

5. The method of claim 1 further comprising the steps of: utilizing one or more temperature sensors and a CDA flow controller for controlling upward and downward fluctuations in the heat provided to the dome of the semiconductor processor.

6. The method of claim 1 further comprising the steps of: maintaining a supply of air comprising the continuously variable CDA flow at a predefined quantity of heat provided to the dome of the semiconductor processor.

7. A method for semiconductor processing, comprising the steps of:
   providing a domed process chamber having a support, a process gas distributor, and an exhaust;
   continuously varying a clean dry air (CDA) flow responsive to temperatures changes in the domed process chamber; and
   actively controlling a dome temperature such that said dome temperature is stabilized in accordance with a preset temperature during a semiconductor manufacturing process and when processing is idle, wherein said active control includes said continuous varying of said CDA flow.

8. The method of claim 7 further comprising:
idling the semiconductor manufacturing process.

9. The method of claim 7, further comprising:
driving an antenna of a plasma reactor chamber by RF energy inductively coupled inside the domed process chamber.

10. The method of claim 9, further comprising:
generating a low energy plasma by the antenna for etching metals, dielectrics and semiconductor materials.

11. The method of claim 9 further comprising:
applying an auxiliary RF bias energy to a wafer support cathode to control a cathode sheath voltage and the ion energy independent of a plasma density in the plasma reactor chamber.

* * * * *